(12) United States Patent
Higashijima et al.

(10) Patent No.: US 8,887,741 B2
(45) Date of Patent: Nov. 18, 2014

(54) LIQUID PROCESSING APPARATUS, LIQUID PROCESSING METHOD AND STORAGE MEDIUM

(75) Inventors: Jiro Higashijima, Koshi (JP); Yoshifumi Amano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 619 days.

(21) Appl. No.: 13/215,778

(22) Filed: Aug. 23, 2011

(65) Prior Publication Data

US 2012/0064256 A1 Mar. 15, 2012

(30) Foreign Application Priority Data

Sep. 13, 2010 (JP) ................................ 2010-204767

(51) Int. Cl.
*B08B 3/00* (2006.01)
*H01L 21/02* (2006.01)
*H01L 21/67* (2006.01)
*H01L 21/687* (2006.01)
*H01L 21/683* (2006.01)

(52) U.S. Cl.
CPC ...... *H01L 21/02087* (2013.01); *H01L 21/6708* (2013.01); *H01L 21/67115* (2013.01); *H01L 21/68735* (2013.01); *H01L 21/68785* (2013.01); *H01L 21/68792* (2013.01); *H01L 21/6838* (2013.01)
USPC .......... 134/94.1; 134/99.1; 134/105; 134/149; 118/641

(58) Field of Classification Search
None
See application file for complete search history.

(56) References Cited

U.S. PATENT DOCUMENTS 6,203,622 B1 * 3/2001 Halpin et al. ................. 118/730

FOREIGN PATENT DOCUMENTS

| JP | 2002-110626 A | 4/2002 |
| JP | 2003-115474 A | 4/2003 |
| JP | 2010-028059 A | 2/2010 |

* cited by examiner

*Primary Examiner* — Eric Golightly
(74) *Attorney, Agent, or Firm* — Abelman, Frayne & Schwab

(57) ABSTRACT

Disclosed is a liquid processing apparatus which performs a liquid processing by supplying a chemical liquid from a chemical liquid supplying unit to substrate rotating around a vertical axis, and includes a cover member arranged at an upper surface of substrate to oppose the substrate and have a space therebetween is provided with a gas supplying port, and gas is supplied from gas supplying port toward the space. The gas is discharged from the space through a gap between protrusion at the circumferential edge of cover member protruding downward and the substrate. In addition, lamp heater heating the circumferential edge of substrate is arranged in the space along the circumferential direction of substrate, the chemical liquid supplied from a chemical liquid supplying unit is supplied to a position closer to the circumferential edge side than a position at which lamp heater is provided.

10 Claims, 7 Drawing Sheets

LIQUID PROCESSING APPARATUS, LIQUID PROCESSING METHOD AND STORAGE MEDIUM

CROSS-REFERENCE TO RELATED APPLICATIONS

This application is based on and claims priority from Japanese Patent Application No. 2010-204767 filed on Sep. 13, 2010 with the Japanese Patent Office, the disclosure of which is incorporated herein in its entirety by reference.

TECHNICAL FIELD

The present disclosure relates to a liquid processing technology that processes a circumferential edge of a substrate to be processed by supplying a chemical liquid thereto.

BACKGROUND

For example, in a manufacturing process of semiconductor devices, there has been a single-wafer type liquid processing in which various chemical liquids are supplied to the surface of a semiconductor wafer (hereinafter referred to as "wafer"), which is used as a substrate to be processed, while maintaining the semiconductor wafer rotatably and rotating the semiconductor wafer around a vertical axis. In such a liquid processing using the chemical liquid, the contact temperature of the chemical liquid with the wafer is increased to enhance the process activity of the chemical liquid, thereby shortening a processing time.

For example, Japanese Patent Laid-Open Publication No. 2003-115474 discloses a technique in which a liquid for heating that was heated in advance is supplied to the central portion of a substrate to increase the temperature of the substrate, so that the contact temperature of the substrate with the chemical liquid supplied to a circumferential edge of the substrate is increased. However, in the technique described above, a chemical liquid supplied to the circumferential edge of the substrate is diluted by the heated liquid, so that the processing time is extended, and even a portion that does not need to be heated is heated as well.

Further, Japanese Patent Laid-Open Publication No. 2010-28059 discloses a liquid processing apparatus performing a liquid processing by supplying a processing liquid to a lower surface side of a wafer held horizontally. The liquid processing apparatus includes a cover member (top plate) arranged at an upper surface of the wafer to oppose and have a space therebetween, and a protrusion provided at the circumferential edge of the cover member along a circumferential direction protruding downward. A gas (inert gas) flows in the space between the cover member and the wafer, passes through a gap between the protrusion and the wafer, and flows outside the wafer. However, there is no description about a mechanism for heating a wafer in the liquid processing apparatus.

SUMMARY

According to an exemplary embodiment of the present disclosure, there is provided an apparatus for performing a liquid processing which comprises a substrate holder configured to hold a substrate to be processed horizontally; a chemical liquid supplying unit configured to supply chemical liquid to a circumferential edge of the substrate while rotating the substrate around a vertical axis; a cover member arranged at an upper surface of the substrate held on the substrate holder to oppose the substrate and have a space therebetween; a gas supplying port provided on the cover member to supply gas to the space; a lamp heater provided in the space along a circumferential direction of the substrate configured to heat the circumferential edge of the substrate; and a protrusion provided at the circumferential edge of the cover member along the circumferential direction protruding downward, so as to form a gap, a height of the gap being smaller than a height between the substrate and the cover member, in the space where the lamp heater is provided. In the apparatus described above, a supplying position of the chemical liquid from the chemical liquid supplying unit is closer to the circumferential edge than a placing position of the lamp heater.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
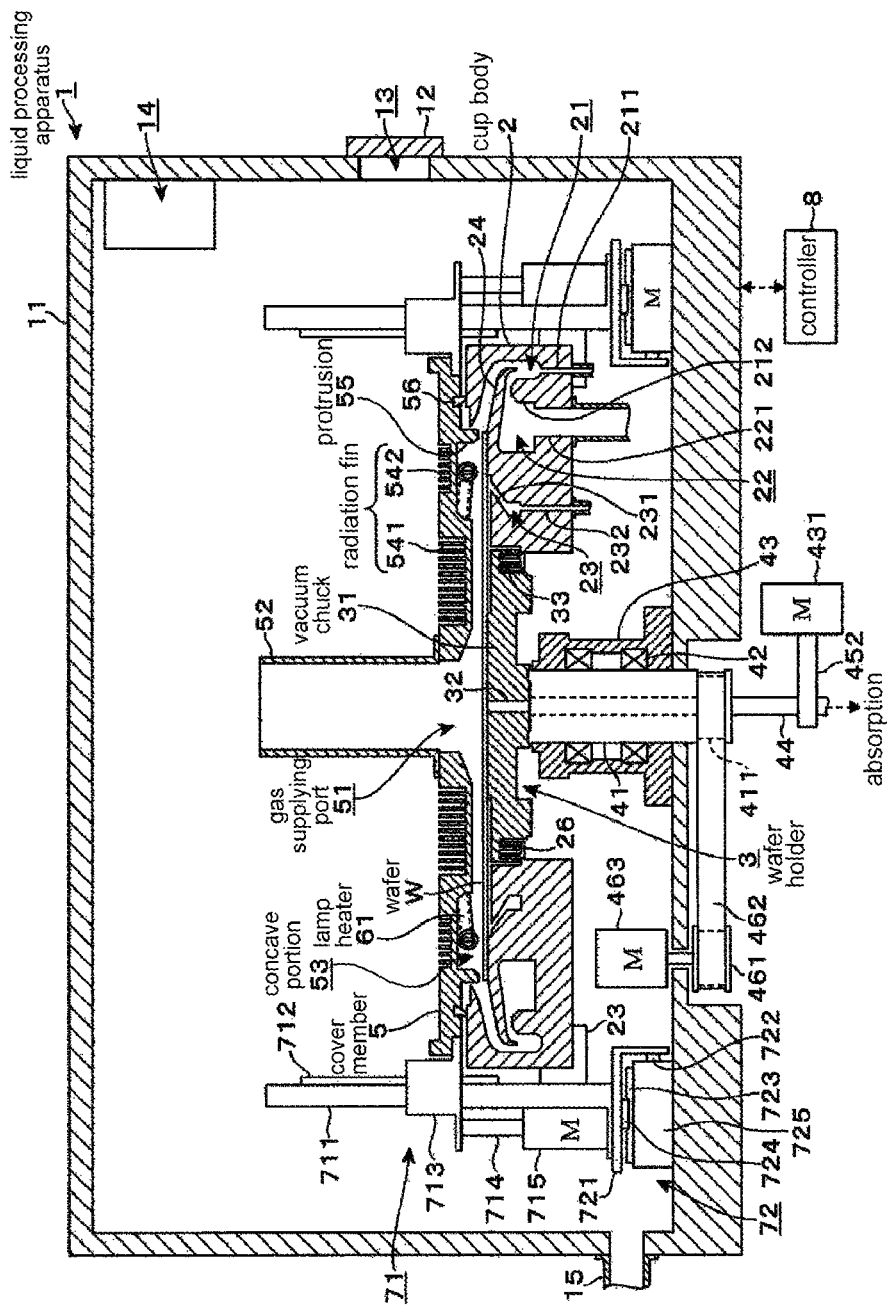
FIG. 1 is a longitudinal cross-sectional view illustrating a liquid processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in consideration of the problems described above to provide a liquid processing method, a liquid processing apparatus and a computer readable recording medium having the method stored therein, capable of enhancing the processing efficiency with a chemical liquid by increasing the temperature of the circumferential edge of a substrate to be processed in a short period of time.

An exemplary embodiment of the present disclosure provides an apparatus for performing a liquid processing which may comprise a substrate holder configured to hold a substrate to be processed horizontally; a chemical liquid supplying unit configured to supply chemical liquid to a circumferential edge of the substrate while rotating the substrate around a vertical axis; a cover member arranged at an upper surface of the substrate held on the substrate holder to oppose the substrate and have a space therebetween; a gas supplying port provided on the cover member to supply gas to the space; a lamp heater provided in the space along a circumferential direction of the substrate configured to heat the circumferential edge of the substrate; and a protrusion provided at the circumferential edge of the cover member along the circumferential direction protruding downward, so as to form a gap, a height of the gap being smaller than a height between the substrate and the cover member, in the space where the lamp heater is provided. In the apparatus described above, a supplying position of the chemical liquid from the chemical liquid supplying unit is closer to the circumferential edge than a placing position of the lamp heater.

In the apparatus for performing a liquid processing, the cover member may be formed along the circumferential direction of the substrate held by the substrate holder and provided with a concave portion open toward a lower surface, and the lamp heater is provided in the concave portion. Further, in the apparatus described above, an inner surface of the concave portion to which the lamp heater is provided may be finished with a mirror-like surface. In this case, the concave portion having the mirror-like inner surface includes a reflecting surface configured to reflect radiant heat emitted from the lamp heater toward a circumferential edge region of the substrate to which the chemical liquid is supplied. Further, in the apparatus described above, the cover member may include a radiation fin, the radiation fin is arranged at the upper surface side of the cover member corresponding to a region where the lamp heater is placed, and the substrate holder includes a vacuum chuck absorbing and maintaining a central portion of the lower surface of the substrate, and the radiation fin is arranged at an interspace of the cover member between the lamp heater and the vacuum when viewed from the upper surface of the cover member.

The apparatus for performing a liquid processing may further include a controller configured to supply electric current to the lamp heater for a period of time during which the chemical liquid is supplied from the chemical liquid supplying unit, and stop supplying electric current to the lamp heater after the supplying of the chemical liquid from the chemical supplying unit is stopped. In the apparatus described above, the chemical liquid may be corrosive. Further, in the apparatus described above, the lamp heater may be formed with an omega ($\Omega$) shape having a notch unit at a ring portion by inserting a narrow and elongated heating element into a protective tube made of quartz. Further, in the apparatus described above, the supplying position of the chemical liquid may be defined at a circumferential edge of a region where the notch portion is formed.

An exemplary embodiment of the present disclosure provides a method for a liquid processing which may comprise supplying a chemical liquid to a circumferential edge of a substrate to be processed held horizontally on a substrate holder while rotating the substrate around a vertical axis; supplying a gas from a gas supplying port provided in a cover member arranged at an upper surface of the substrate held on the substrate holder to oppose the substrate and have a space therebetween; heating circumferential edge of the substrate by a lamp heater provided in the space along a circumferential direction of the substrate; providing a protrusion at the circumferential edge of the cover member along the circumferential direction protruding downward so as to form a gap, a height of the gap being smaller than a height between the substrate and the cover member, in the space where the lamp heater is provided; and defining a supplying position of the chemical liquid from the chemical liquid supplying unit to be closer to the circumferential edge than a placing position of the lamp heater.

The method for a liquid processing may further include after the supplying step of the chemical liquid, performing a rinsing process with deionized water, a spin drying process spinning off the deionized water from the substrate, and heating the circumferential edge of the substrate by a lamp heater. In the method described above, the chemical liquid is corrosive.

Still further, the present disclosure may provide a non-transitory computer-readable recording medium storing a computer executable program that, when executed, causes a computer to perform the method for a liquid processing as described above.

According to the exemplary embodiments of the present disclosure, the circumferential edge of the substrate to be processed can be efficiently heated by heating the substrate, a gas and a liquid supplied thereto, so that a processing efficiency with the chemical liquid can be enhanced.

As an exemplary embodiment according to the present disclosure, there is provided a liquid processing apparatus in which Hydrofluoric acid (HF) as a chemical liquid is supplied to the surface of a circular substrate to be processed, on which semiconductor devices are formed, for example, a wafer W having a diameter of 300 mm to remove an unnecessary film formed on a circumferential edge of wafer W. In the exemplary embodiment, the surfaces of wafer W refers to both an upper surface on which the semiconductor devices are formed and a lower surface opposing the upper surface side.

As shown in longitudinal cross-sectional view of FIG. 1, a liquid processing apparatus 1 of the exemplary embodiment includes a wafer holder 3 holding wafer W to be rotatable around a vertical axis, a cup body 2 provided to surround a circumference of wafer W held on wafer holder 3 and configured to receive the chemical liquid dispersed from wafer W, and a cover member 5 arranged at an upper surface of the substrate held on a substrate holder to oppose the substrate and have a space therebetween to allow gas to be through-flowed the space, a lamp heater 61 heating wafer W, the chemical liquid or gas with radiant heat, and a elevating mechanism 71 moving cover member 5 up and down. Further, as shown in FIGS. 2 to 5, liquid processing apparatus 1 includes chemical liquid supplying units 62 and 25 supplying the chemical liquid to a circumferential edge of wafer W.

Cup body 2, wafer holder 3 and cover member 5 are accommodated within a common case 11, and an air flow introducing portion 14 which is open for receiving clean air from outside is provided on the vicinity of a ceiling portion of case 11. Meanwhile, a gas exhaust port 15 discharging atmosphere in case 11 is provided on the vicinity of a bottom surface of case 11, and a down flow is formed in which clean air introduced from air flow introducing portion 14 flows from upper side to lower side. Reference numeral 13 shown in case 11 represents a carrying in-out port for which wafer W provided on a pick of a wafer transfer mechanism (not shown) located outside is carried in and out, and reference numeral 12 represents a shutter which opens and closes carrying in-out port 13.

Figure 6:
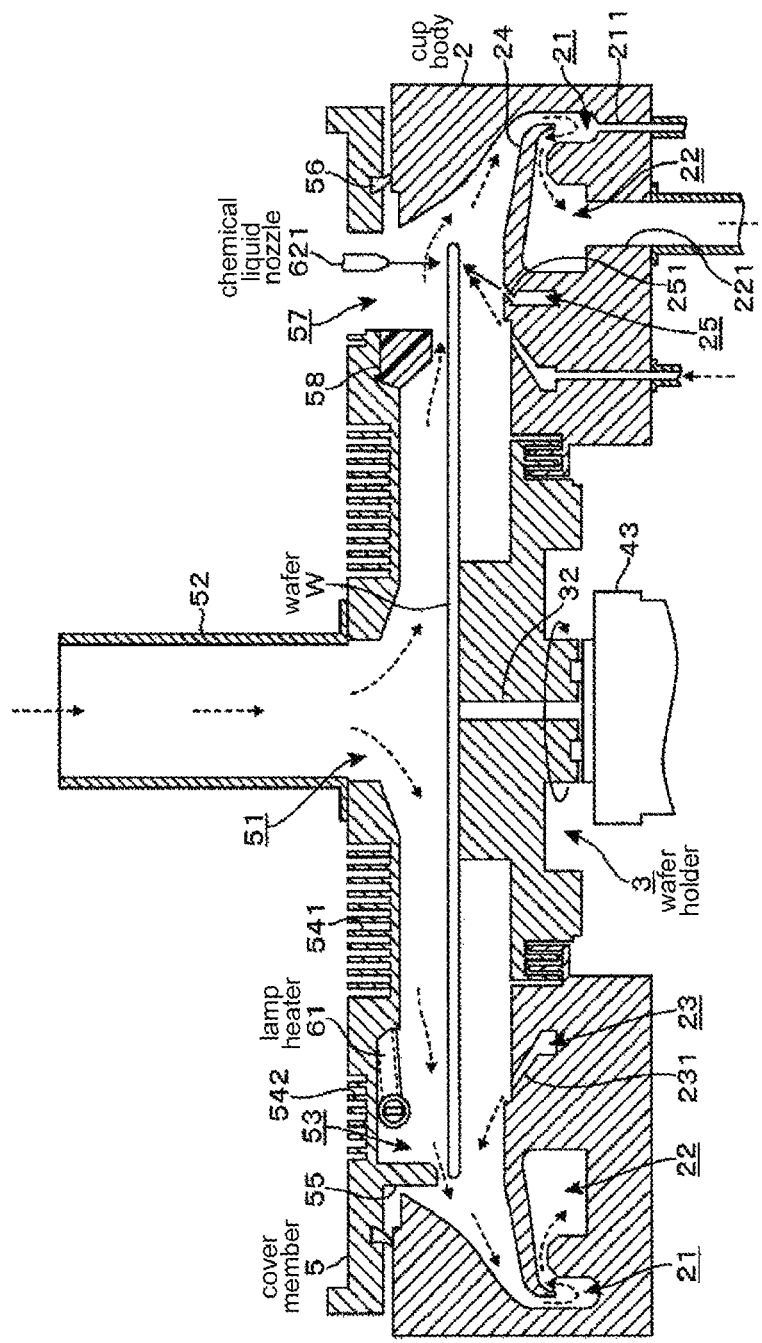
FIG. 6 is a first explanatory view illustrating an operation during a liquid processing execution.

Wafer holder 3 is configured with a disk shaped member, and a vacuum chuck 31 absorbing and holding wafer W is provided at a central portion of upper surface side of the wafer holder. As shown in FIG. 6, vacuum chuck 31 has a central portion of the upper surface side of the wafer holder 3 formed to be protruded in a disk shape, and an absorbing port 32 located at a central portion of the protrusion is open and can fix wafer W to vacuum chuck 31 by absorbing a lower surface of wafer W. FIG. 6 illustratively enlarges the dimension of upward and downward directions.

As such, wafer W is held on vacuum chuck 31 of which central portion is protruded to form a gap with the lower surface of wafer W with which vacuum chuck 31 is not attached and the upper surface of wafer W of a region of outer circumferential side of vacuum chuck 31 in which vacuum chuck 31 is not formed. In FIG. 1, reference numeral 33 represents a seal member which is formed at the circumferential edge of wafer holder 3 and is crossed with a seal member provided at cup body 2 side in upward and downward directions to form a labyrinth seal.

As shown in FIG. 1, a cylindrical lifter 44 for moving wafer holder 3 up and down is connected to a central portion of lower surface side of the wafer holder 3. Lifter 44 is inserted into a cylinder shaped rotating shaft 41, which supports wafer holder 3 from the lower surface side independent of lifter 44 and extends downward vertically. Lifter 44 inserted into rotating shaft 41 penetrates through the bottom surface of case 11 to protrude downward, and the lower end portion of lifter 44 is connected to vacuum exhaust portion provided outside and constituted, for example, by a vacuum pump.

As such, absorbing port 32 is connected to the vacuum exhaust portion through lifter 44 to realize absorption and maintenance of wafer W in vacuum chuck 31. Here, wafer holder 3 is connected with lifter 44 by means of, for example, a rotary joint, and lifter 44 can maintain a stationary state even when wafer holder 3 rotates around the vertical axis.

Lifter 44 of which the lower end portion is connected to a cylinder motor 431 through an elevating plate 452, and cylinder motor 431 is driven to move elevating plate 452 and lifter 44 upward and downward, causing wafer holder 3 to be moved up and down. As a result, wafer W can be delivered between wafer holder 3 and the pick having been entered above wafer holder 3 by making wafer holder 3 to be projected from or retracted into an opening provided on upper surface of cup body 2.

Rotating shaft 41 supporting wafer holder 3 from the lower surface thereof is supported at the bottom surface of case 11 through a casing 43 having an axis support 42 such as bearing therein. Rotating shaft 41 of which lower end is protruded from the bottom surface of case 11, and lower end is provided with a pulley 411. Meanwhile, a motor 463 is provided at a lateral position of rotating shaft 41 and a pulley 461 is provided at a rotating shaft of a motor 463 as well. A driving belt 462 is wound around both of pulleys 411 and 461 to configure a rotation mechanism of rotating shaft 41, and driving motor 463 can be actuated to rotate the rotating shaft at any desired rate.

Concave and convex portions are formed in the upper end of rotating shaft 41 and the lower surface of wafer holder 3 that correspond to a contacting portion of rotating shaft 41 and wafer holder 3, respectively, along a circumferential direction of the cylinder shaped rotating shaft. The concave and convex portions are engaged with each other to transfer the rotation force of rotating shaft 41 to wafer holder 3, so that the wafer W held on wafer holder 3 can be rotated.

Cup body 2 is a ring shaped member provided to surround an outer circumference of wafer holder 3 described above, and functions to receive a chemical liquid supplied to wafer W and separate it with gas, and discharge either gas or the chemical liquid outside. The inner circumference of cup body 2 having a ring shape is open with a size enough to be able to fit wafer holder 3 into the inner circumference, and a seal member 26 crossed with a seal member 33 of wafer holder 3 side upward and downward to form a labyrinth seal is provided at the inner circumference surface of the opening.

Outside the area at which seal member 26 is provided, when lifer 44 connected to wafer holder 3 is moved down to make wafer holder 3 to be supported by rotating shaft 41, cup body 2 having a planar upper surface is provided at a position of height where the upper surface of wafer holder 3 of outer circumference side of vacuum chuck 31 is substantially the same with that of cup body 2. Further, a gas supplying port 231 is open along the circumferential direction of the cup body, at the planar upper surface of cup body 2. For example, gas such as nitrogen gas is supplied to the circumferential edge of the lower surface of wafer W held on wafer holder 3. In FIG. 1, reference numeral 23 represents a gas supplying space for supplying gas to gas supplying port 231, and reference numeral 232 represents a gas introducing line for introducing gas to the gas supplying space.

Two grooves that are open toward the upper surface side are formed along the circumferential direction of cup body 2, at the farther outer circumference side of planar upper surface region of cup body 2. The outer groove of the grooves functions as a liquid receiving space 21 receiving a chemical liquid that has been through with a liquid processing to discharge it outside. The inner groove of the grooves functions as a gas exhaust space 22 collecting gas separated from the chemical liquid in liquid receiving space 21 to discharge the collected gas outside. Two spaces 21 and 22 are separated with each other by a separating wall 212. Meanwhile, a guide plate 24 is extended from the inner circumferential side in an awning shape, and covers entirely an opening of gas exhaust space 22 and partially an opening of liquid receiving space 21.

A gap is formed between the lower surface of guide plate 24 and separating wall 212 described above, so that gas exhaust space 22 is communicated with liquid receiving space 21 through the gap. As a result, a mixed fluid flowed into liquid receiving space 21 is separated into gas and liquid, and the separated gas is guided into gas exhaust space 22, so that liquid (chemical liquid) and air (gas) is individually discharged.

An element provided at the bottom of liquid receiving space 21 denoted by reference numeral 211 is a liquid exhaust port for discharging the chemical liquid gathered within liquid receiving space 21, and an element provided at the bottom of gas exhaust space 22 denoted by reference numeral 221 is an gas exhaust port for discharging the gas introduced into gas exhaust space 22. A gas exhaust port 221 is connected to, for example, a vacuum pump (not shown), and is able to maintain an inside of gas exhaust space 22 at a negative pressure lower than a pressure of inside of case 11 outside cup body 2 by absorbing and maintaining gas within gas exhaust space 22.

Further, the side wall (outer wall of cup body 2) of outer circumferential side of liquid receiving space 21 is extended toward upper side than guide plate 24 described above, and then curved toward inner side of cup body 2 to cross a guide plate 24 in a lateral direction. A space of gap formed between the outer wall of cup body 2 and guide plate 24 forms a flow path, which guides the mixed fluid of the chemical liquid and gas that have been through with the liquid processing toward liquid receiving space 21.

Further, the outer wall of cup body 2 curved toward inside thereof has an inner circumferential edge arranged in order for the outer wall is to be open with a diameter larger than that of wafer W held on wafer holder 3. Accordingly, wafer W can be moved up and down, through the opening, between a process position at which the liquid processing is performed while rotating wafer W and a delivery position at which wafer W is delivered to and from a pick located outside.

Cover member 5 is a disk shaped member provided to oppose the upper surface of wafer W held on wafer holder 3, and functions to form a space adapted for making gas to be through-flowed between wafer W and the cover member. In the exemplary embodiment, cover member 5 is formed with a size enough to cover the entire opening formed at upper surface side of cup body 2, and the outer circumference thereof is arranged at the outer wall of cup body 2 curved toward inside to be overlapped therewith.

Figure 3:
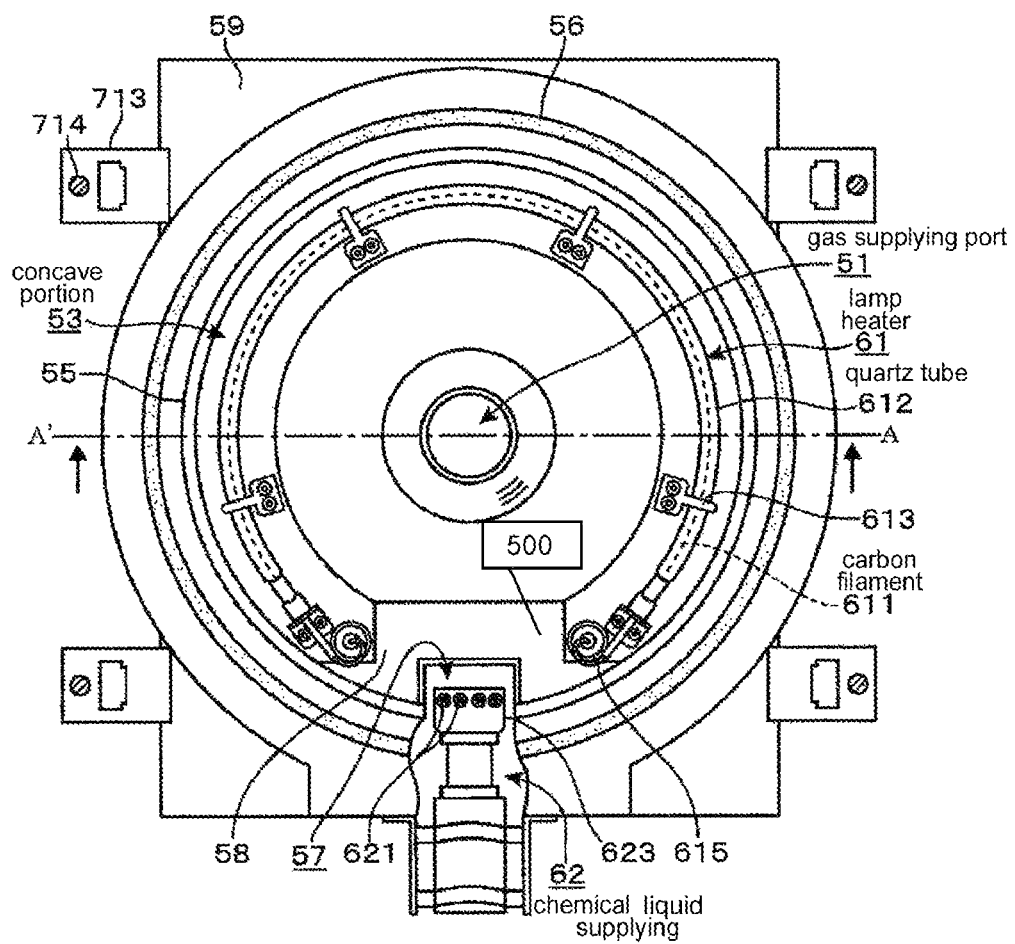
FIG. 3 is a bottom plan view illustrating the cover member when viewed from a lower surface side.

The central portion of cover member 5 is provided with a gas supplying port 51, which receives clean air contained within case 11 to supply into the space. Gas supplying port 51 is connected to a chimney shaped air supplying tube 52 of which upper end is open toward the space within case 11. Further, reference numeral 56 shown in FIGS. 1 and 3 represents a seal member which prevents outside gas from being introduced through a gap between cover member 5 and cup body 2, when cover member 5 is placed on cup body 2. The gas (clean air) supplied from gas supplying port 51 functions to prevent ambient atmosphere containing mist of the chemical liquid from being flowed backward and entered into the upper surface side of wafer W. Further, cover member 5 includes a concave portion 53 provided with lamp heater 61 and radiation fins 541 and 542, radiating heat received from lamp heater 61. The configurations of the radiation fins and the concave portion will be described in detail along with lamp heater 61 which will be described later on.

Cover member 5 is supported to be movable up and down by an elevating mechanism 71, while cup body 2 is maintained at a positioning mechanism 72 performing a correct positional-alignment for a placing position, so that when wafer holder 3 moves up and down or rotates, seal members 26 and 33 are not contacted with each other.

Figure 2:
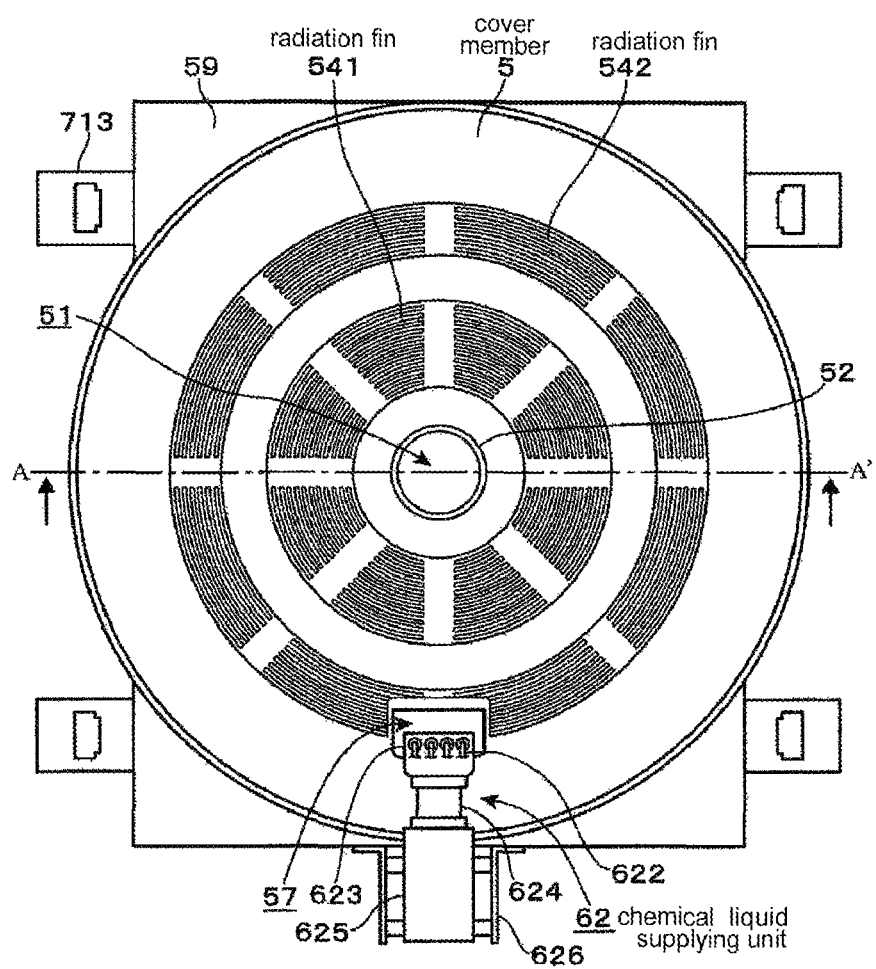
FIG. 2 is a top plan view illustrating a cover member provided in the liquid processing apparatus, when viewed from an upper surface side.

First, reference is made to elevating mechanism 71. As shown in FIGS. 1 to 3, elevating mechanism 71 includes a slider 713 provided to be fixed to a flange 59 of which four corners are protruded from a main body of cover member 5, a pillar member 711 penetrating slider 713, and a guide rail 712 provided along pillar member 711. And a rod 714 connected to slider 713 can be extended and retracted to move up and down cover member 5 by raising and up and down slider 713. Here, FIG. 1 is a longitudinal sectional view of liquid processing apparatus 1 taken along arrow A-A' of FIGS. 2 and 3, and for the sake of the illustration, only two elevating mechanisms 71 are illustrated, and flange 59 is omitted.

Positioning mechanism 72 is fixed to a side of pillar member 711 constituting elevating mechanism 71, and includes a holder member 23 maintaining cup body 2, and a support plate portion 721 supporting a lower end of pillar member 711. Support plate portion 721 is provided on a guide rail 723 through a slider 724, and guide rail 723 is provided on the upper surface of a cylinder motor 725 which extends and retracts a rod 722 in a lateral direction.

The curved piece of supporting plate portion 721 curved in L shape toward lower side is connected to rod 722 to move support plate portion 721 in lateral direction, so that the placing location of cover member 5 or cup body 2 supported on support plate portion 721 can be moved in lateral direction through elevating mechanism 71 or a holder member 23. Cup body 2 is also provided with the flange which is held by holder member 23, similar to cover member 5 shown in FIGS. 2 and 3. However, for the convenience of the illustration, the description of the flange of cup body 2 is omitted.

Liquid processing apparatus 1 as described above is configured to efficiently heat the circumferential edge of wafer W where liquid processing is performed to increase a processing activity of wafer W. Hereinafter, a mechanism for heating wafer W will be described in detail. Here, the circumferential edge of wafer W where liquid processing is performed indicates a region of wafer W on which semiconductor devices cannot be formed, corresponding to further outer circumference side than that of wafer W on which semiconductor devices are formed, in liquid processing apparatus 1 of the exemplary embodiment.

Liquid processing apparatus 1 in the exemplary embodiment as a mechanism for heating the circumferential edge of wafer W includes narrow and elongated lamp heater 61 formed to be extended along the circumferential direction wafer W held on wafer holder 3. Lamp heater 61 is configured to allow a carbon filament 611 used as a narrow, elongated and thin plate shaped heating elements to be inserted into a quartz tube 612 used as protective tube formed with a ring shape and having a diameter of several mm to dozens mm or so, and an inert gas is encapsulated within quartz tube 612. As shown in FIG. 3, lamp heater 61 is formed with a ring shape in which both ends of narrow and elongated quarts tube 612 are being spaced apart. Hereinafter, this shape is referred to as an omega (Ω) shape, and a region in which both ends of quartz tube 612 are spaced apart referred to as a notch portion 500.

Lamp heater 61 heats directly the circumferential edge of wafer W by using a radiant heat, and also functions to heat a chemical liquid supplied to the circumferential edge or gas through-flowed a space between cover member 5 and wafer W. The chemical liquid among wafer W, the chemical liquid and gas heated by lamp heater 61 are difficult to be heated since they contain a lot of water and have a large specific heat. Therefore, a lamp heater, which is emitting a large amount of electromagnetic wave corresponding to electromagnetic absorption wavelength by water, may be employed as lamp heater 61 in liquid processing apparatus 1. A lamp heater that emits larger amount of electromagnetic wave corresponding to electromagnetic absorption wavelength by water, as compared to a halogen heater, may be employed for use as lamp heater 61 utilizing a carbon filament 611.

Figure 7:
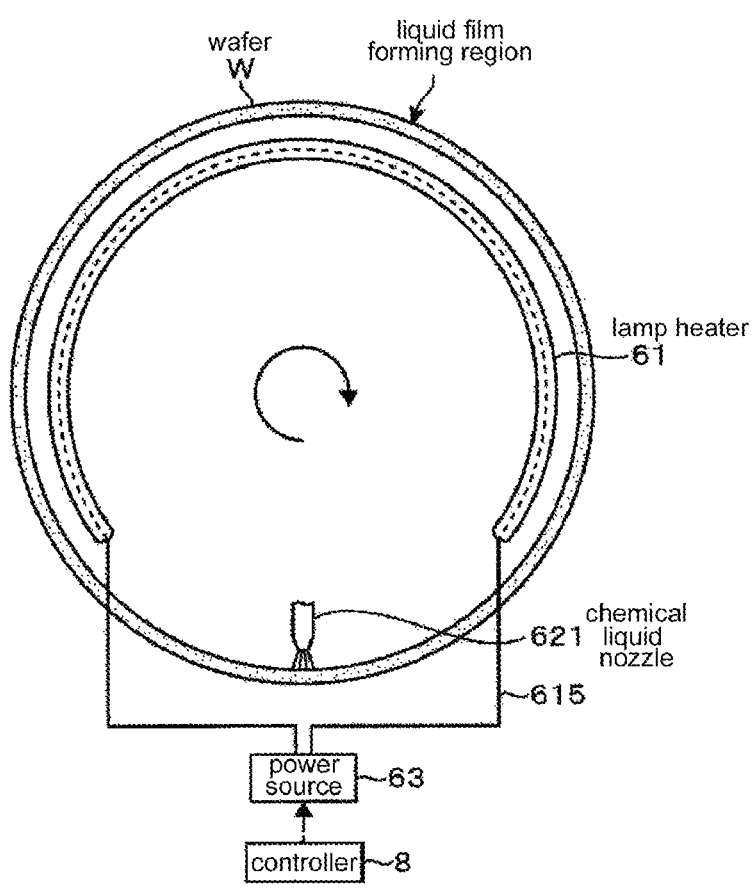
FIG. 7 is a second explanatory view illustrating an operation during a liquid processing execution.

As shown in FIGS. 1 and 3, lamp heater 61 is placed within concave portion 53 formed in cover member 5. Concave portion 53 is open toward lower surface side opposing wafer W and of which plane shape is an omega (Ω) shape adapted for the shape of lamp heater 61. Lamp heater 61 is fixed to a ceiling portion of concave portion 53 by a fixing member 613. As shown in FIG. 3, power lines 615 sheathed with a metal tube are extended from both ends of lamp heater 61, and power lines 615 as shown in FIG. 7 are connected to a power source 63 configured to be able to increase and decrease a power to be supplied.

Figure 4:
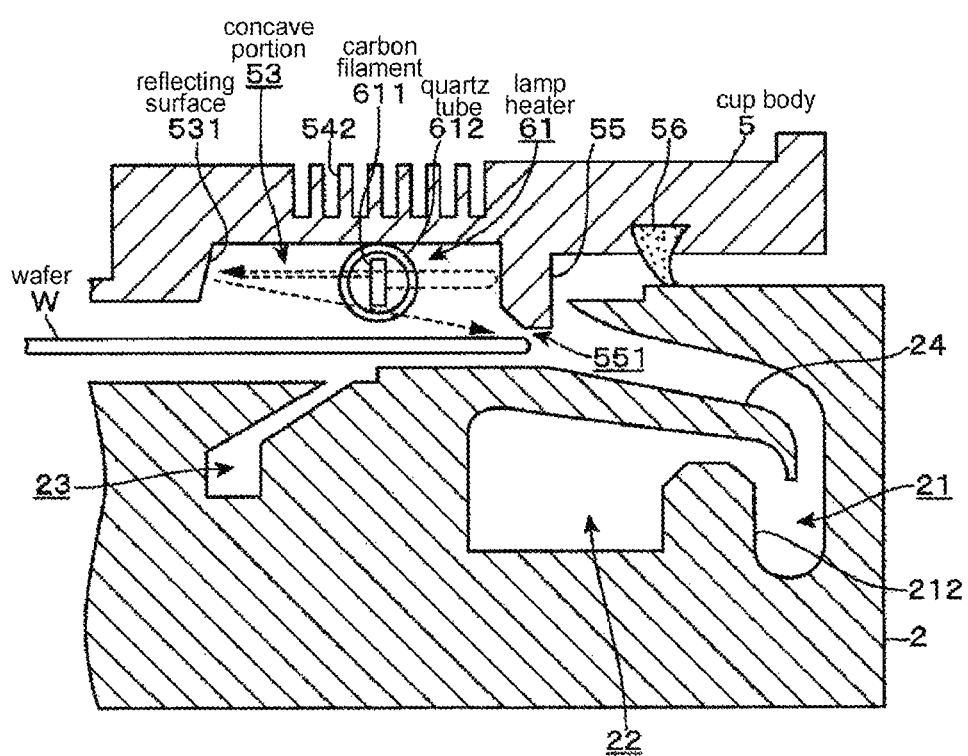
FIG. 4 is a longitudinal cross-sectional view illustrating a placing position of a heater provided in the liquid processing apparatus.

As shown in longitudinal sectional view of FIGS. 1 and 4, a member constituting cover member 5 is protruded downward in the inner circumferential side and outer circumferential side regions with respect to the center of cover member 5 in concave portion 53 accommodating lamp heater 61 to separate concave portion 53 from other regions. That is, a region provided at a central region of cover member 5 between gas supplying port 51 and concave portion 53 is protruded downward with respect to the upper surface of concave portion 53, and a narrow gap having a height of, for example, 0.5 mm to 3 mm is formed between the bottom surface of the protrusion and wafer W of wafer holder 3, in the inner circumferential side region of concave portion 53.

Meanwhile, a circumferential edge of cover member 5 is protruded downward to form a protrusion 55, and a narrow gap having a height of, for example, 0.5 mm to 3 mm is formed between protrusion 55 and wafer W of wafer holder 3 in the outer circumferential side region of concave portion 53. Here, since concave portion 53 is configured to be able to accommodate lamp heater 61 having a diameter of several mm to dozens of mm as described above, the height of the gap between protrusion 55 and wafer W is smaller than that of the gap between an upper surface of concave portion 53 and wafer W.

As such, protrusion 55 functions to form a narrow gap with wafer W to prevent gas from being discharged from concave portion 53, and guide a flow of gas to pass through near the chemical liquid supplied to the circumferential edge region of wafer W. Further, when corrosive liquid such as hydrofluoric acid (HF) liquid is utilized, protrusion 55 functions to prevent mist of the chemical liquid dispersed from a rotating wafer W from being reintroduced into concave portion 53 to be adhered to quartz tube 612 and to erode quartz or the like.

Further, an inner surface of concave portion 53 is finished with mirror-like surface, so that radiant heat of lamp heat 61 can be reflected toward wafer W. In particular, a side wall surface of inner circumferential side of concave portion 53 is provided with a reflecting surface 531 inclined to allow an electromagnetic wave incident on the side wall surface to be reflected toward the circumferential edge of wafer W. In the exemplary embodiment, the inclined surface of reflecting surface 531 is configured to be flattened out. However, the electromagnetic wave reflected from reflecting surface 531 may be focused to a narrower region by making a shape of longitudinal cross section to be concave curved surface.

As described above, lamp heater 61 is provided at a space formed between wafer W and cover member 5 along the circumferential direction of wafer W in liquid processing apparatus 1. Therefore, cover member 5 forming concave portion 53, in addition to wafer W, the chemical liquid and gas, are also heated by lamp heater 61. Further, since the same cover member 5 is used at each liquid processing, unlike wafer W replaced per each liquid processing, a heat accumulation of cover member 5 is gradually progressed and a temperature thereof is getting increased.

Thus, if the temperature of cover member 5 is getting increased, the influence of heat on the surrounding devices by cover member 5 is also increased, and, for example, a positional alignment of cup body 2 by a positioning mechanism 72 needs to be considered for thermal expansion, so that a positional adjustment becomes difficult. Further, if an adsorbing surface of vacuum chuck 31 suffers from warping caused by thermal expansion or the like, a force for absorbing and maintaining wafer W is reduced, so that a degradation of rotation speed of wafer W may be occurred. Still further, there is a kind of processing liquid not required to be heated. However, if thermal capacity of cover member 5 is large at the time of switching from a processing liquid required to be heated to a processing liquid not required to be heated, it is required to be waited until the temperature of cover member 5 is decreased to a temperature not influencing the processing liquid, so that a loss of time becomes large.

Therefore, a plurality of radiant fins 541 and 542 to suppress increase of the temperature by efficiently radiating heat absorbed from lamp heater 61 are provided at the upper surface of cover member 5. As shown in FIGS. 1 and 2, radiant fins 541 and 542 are provided at the outer circumferential side and inner circumferential side regions of the upper surface of cover member 5, in a ring shape. As shown in FIG. 1, the outer circumferential side region provided with radiant fin 542 corresponds to the ceiling portion of concave portion 53 accommodating lamp heater 61. Radiant fin 542 is provided to a region, where the temperature is increased with direct heating of lamp heater 61 most largely, so that heat can be emitted efficiently. Further, the thickness of the region of cover member 5 at which radiant fin 542 is provided is thinner than that of other regions, so that thermal capacity of the region is decreased, causing heat accumulation to be suppressed.

Meanwhile, the inner circumferential side region provided with radiant fin 541 corresponds to an intermediate area of a region formed between concave portion 53 accommodating lamp heater 61 and upper region of vacuum chuck 31 formed at wafer holder 3, when viewed from upper surface side of cover member 5. Radiant fin 541 functions to increase thermal resistance between concave portion 53 and upper region of vacuum chuck 31 to prevent an adsorbing ability of vacuum chuck 31 for wafer W from being decreased due to warping of vacuum chuck 31 caused by thermal expansion, as described above. The thickness of cover member 5 in the region provided with radiant fin 541 is also made to be thinner than that of other regions. With this configuration, thermal capacity of the region is decreased, causing heat accumulation to be suppressed.

Next, there is described a configuration of a chemical liquid supplying unit supplying a chemical liquid to the circumferential edge of wafer W. In a liquid processing apparatus 1 according to the exemplary embodiment, the chemical liquid can be supplied to the circumferential edge of wafer W from each of both upper surface and lower surface sides of wafer W.

First, the configuration of a chemical liquid supplying unit 62 will be described with reference to FIGS. 2, 3 and 5. As shown in FIG. 3, a chemical liquid supplying unit 62 of the exemplary embodiment is configured to provide an opening 57 at a plate surface corresponding to notch portion 500 and supply the chemical liquid to the circumferential edge of wafer W by inserting a chemical liquid nozzle 621 into opening 57.

Figure 5:
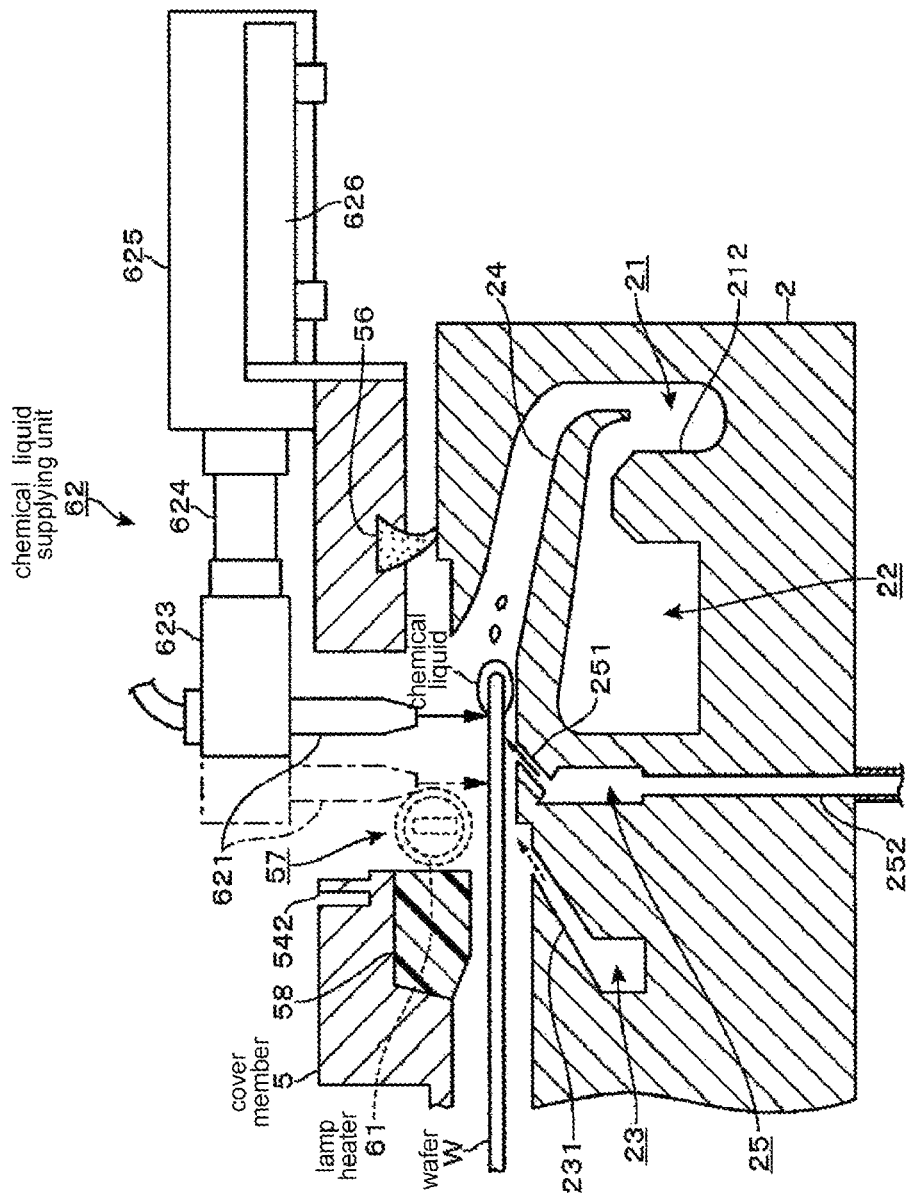
FIG. 5 is a side view illustrating a configuration of a chemical liquid nozzle provided in the liquid processing apparatus.

As shown in FIG. 5, chemical liquid nozzle 621 is maintained at a nozzle holder 623, and nozzle holder 623 is connected to a rod 624 extending and retracting in lateral direction by a cylinder motor 625, so that the maintaining position of chemical liquid nozzle 621 can be moved. As shown in FIGS. 2 and 3, chemical liquid supplying portion 62 is attached to cover member 5 to cause a nozzle holder 623 to be moved toward a diametric direction of cover member 5. As a result, chemical liquid supplying unit 62 can supply the chemical liquid to wafer W while changing a distance from outer circumferential end of wafer W. Here, reference numeral 626 indicated in FIG. 5 represents a supporting member that supports cylinder motor 625 to be fixed to cover member 5.

Further, with reviewing particularly a positional relationship between a position to which the chemical liquid is supplied from chemical liquid nozzle 621 and a position to which lamp heater 61 is placed, the position to which chemical liquid is supplied from chemical liquid nozzle 621 is defined closer to circumferential edge side in a diametric direction of wafer W than lamp heater 61, when viewed from wafer W. In order to simply represent the positional relationship, a position of lamp heater 61, on the assumption that lamp heater 61 is extended to a region of the notch portion, is represented by a broken line and the chemical liquid supplying position of chemical liquid nozzle 621 is represented by a solid line and a dashed dotted line.

Nozzle holder 623 maintains a plurality of chemical liquid nozzles 621, which is connected to a chemical liquid supplying source (not shown) through a chemical liquid supplying line 622. With control signals received from a controller 8, which will be described later, supplying of the chemical liquid from chemical liquid supplying source is allowed or blocked to execute the supplying or stopping of chemical liquid from chemical liquid nozzle 621. Each of chemical liquid nozzles 621 is connected to a different type of chemical liquid supplying source, so that a different kind of chemical liquid according to the liquid processing type can be supplied. For a liquid processing of removing an unnecessary film formed at the circumferential edge of wafer W, HF liquid for film removal and Deionized Water (DIW) for rinse cleaning are supplied.

Here, reference numeral 58 indicated in FIGS. 3 and 5 represents a guard member preventing mists of the chemical liquid supplied from chemical liquid nozzles 621 from being entered into concave portion 53 to which lamp heater 61 is placed. A guard member 58 made of corrosion resistant resin such as fluorine resin, is protruded from a lower surface of cover member 5 and forms a narrow gap with wafer W. The narrow gap functions to prevent mist of HF liquid or the like from being entered into concave portion 53 side from a space to which the chemical liquid is supplied. As shown in FIG. 3, guard member 58 is provided to surround three sides i.e., an inner side, and a left and a right sides of diametric direction of opening 57 formed with a rectangular shape, when viewed from chemical liquid supplying unit 62.

Next, a configuration of a chemical liquid supplying unit supplying the chemical liquid to the lower surface side of wafer W is described. As shown in FIG. 5, the chemical liquid supplying unit for the lower surface side is constituted by a chemical liquid supplying space 25 formed in cup body 2 and a chemical liquid supplying port 251 extending from chemical liquid supplying space 25 to be open toward the lower surface side of the circumferential edge of wafer W hold on wafer holder 3. Chemical liquid supplying space 25 is connected to a chemical liquid supplying source (not shown). With control signals received from controller 8, supplying of the chemical liquid from chemical liquid supplying source is allowed or blocked to execute the supplying or stopping of chemical liquid from chemical liquid supplying port 251.

A plurality of chemical liquid supplying unit composed of chemical liquid supplying space 25, chemical liquid supplying port 251 and a chemical liquid introducing line 252 are provided within cup body 2. Each of chemical liquid supplying portions is connected to the different type of chemical liquid supplying source, and can supply a different kind of the chemical liquid according to the liquid processing type. The placing position of the chemical liquid supplying unit may be placed within a region provided with opening 57 in which a leaking of the mist of the chemical liquid is being suppressed by guard member 58, so as not to form a path where the mist of the chemical liquid supplied to the circumferential edge of wafer W goes around and flows onto the upper surface of wafer W to be introduced into concave portion 53.

Further, as shown in FIGS. 1 and 7, a controller 8 is connected to liquid processing apparatus 1. Controller 8 is constituted by a computer including a CPU and storage part (not shown). The storage part stores the operational steps of controller 8. Specifically, the storage part stores a computer program having a logical structuring of steps relating to operations carried for wafer W, and then removes an unnecessary film formed on the surface of circumferential edge of wafer W by performing a liquid processing, and then cleans by rinsing, and dries, and then carries out wafer W. The computer program is stored in a recording medium such as a hard disc, compact disc, opto-magnetic disc and memory card, and installed on computer from the recording medium.

The operations of liquid processing apparatus 1 configured as described above is described with reference to FIGS. 6 and 7. In FIGS. 6 and 7, a portion of rotating shaft 41 rotating wafer W holder 3 is omitted. First, liquid processing apparatus 1 raises wafer holder 3 to a transferring position of wafer W by retracting elevation mechanism 71 upward, at the time of carrying in of wafer W. At this time, a down flow of clean air flowing from upper side toward lower side has been formed in case 11. Thereafter, a shutter 12 of case 11 is open and a pick holding wafer W is entered to a position corresponding to the height between cover member 5 and wafer holder 3 retracted. Continuously, the pick is lowered to be crossed with wafer holder 3, wafer W is transferred to wafer holder 3, and then the pick is retracted from inside of case 11 to have it gone outside.

Wafer W is absorbed and maintained on wafer holder 3 by vacuum chuck 3, and wafer holder 3 is moved down to dispose wafer W within cup body 2. If a position of cup body 2 has been misaligned upon moving down of wafer holder 3, positional alignment mechanism 72 is actuated to move cup body 2 to a correct position. Thereafter, as shown in FIG. 6, cover member 5 is moved down to form a space, where a gas is flowed, between cover member 5 and wafer W. And since a gas exhaust space 22 is maintained at a negative pressure, clean air within case 11 is introduced into a space between wafer W and cover member 5 being communicated with gas exhaust space 22 through a gas supplying tube 52 and gas supplying port 51. As such, the clean air supplied into the space from gas exhaust port 51 becomes gas to be flowed from a central portion of wafer W toward the circumferential edge side in the upper surface of wafer W.

Meanwhile, a gas such as nitrogen gas is supplied from a gas supplying space 23 open toward circumferential direction on the upper surface of cup body 2 toward the circumferential edge of the lower surface side of wafer W. The gas is combined with a gas of the upper surface to flow toward liquid receiving space 21 and gas exhaust space 22. Here, in FIG. 6, a dimension of a height direction from the upper surface of wafer holder 3 to a lower surface of cover member 5 is enlarged to make easily understand a flow of gas or a chemical liquid.

As such, in parallel to an operation of forming a space in which gas flows between the wafer W and cover member 5 by lowering cover member 5, heating of circumferential edge portion of wafer W is initiated by supplying electric current from power source 63 to lamp heater 61 when cover member 5 is placed on cup body 2. At this time, since the chemical liquid is not yet supplied on the surface of wafer W, a circumferential edge region of wafer W is heated by direct conduction of radiant heat from lamp heater 61.

Further, the gas that flows in a space between cover member 5 and wafer W is introduced into concave portion 53, stayed for a sufficient time therein to be sufficiently heated, and then passes through a gap between wafer W and protrusion 55, and flows toward cup body 2. In this case, the gas is prevented from being discharged due to protrusion 55 provided, and a heated gas is efficiently contacted with wafer W within concave portion 53, so that wafer W can be heated.

The target value of the temperature of the circumferential edge of wafer W is adequately set according to the kinds of the chemical liquids to be used or a type of liquid processing. However, for example, the temperature of the circumferential edge of wafer W after the supplying of the chemical liquids is initiated is increased until the temperature becomes a temperature higher than 60° C. by several ° C. to dozens ° C., in the exemplary embodiment using HF liquid. In this case, an output of lamp heater 61 is determined by a data obtained by an experiment in advance. Further, in this case, a thermocouple may be provided in concave portion 53 to increase or decrease the output of lamp hearer 61 while performing a feedback control by controller 8 to allow the temperature of concave portion 53 to approach the target value.

As such, if cover member 5 is lowered, gas is supplied to both the upper and lower surfaces of wafer W and the heating for the circumferential edge of wafer W is started by initiating supplying power to lamp heater 61. A rotation of wafer W is initiated and accelerated until rotational speed reaches 2000 rpm. In parallel to the accelerating operation, a chemical liquid nozzle 621 waiting at outer side of wafer W moves to a location at which the liquid processing is performed while discharging HF liquid by initiating a dummy dispense of HF liquid. Meanwhile, the supplying of chemical liquid to the lower surface of wafer W from a chemical liquid supplying port 251 is also initiated, and if chemical liquid nozzle 621 reaches a predetermined position, an unnecessary film is removed from the circumferential edge by supplying HF liquid to the upper and lower surfaces of wafer W for a preset time.

When HF liquid is supplied to wafer W being rotated, the HF liquid is, as shown in FIG. 7, spread out the circumferential edge region in a ring shape to remove the film of the region. And, the HF liquid spun off from wafer W is guided to a guide plate 24 and introduced into liquid receiving space 23 together with gas, and a liquid separated from the gas is discharged from a liquid exhaust port 211. Further, gas separated from the liquid is introduced into gas exhaust space 22 and is discharged from gas exhaust port 221.

In this case, if the HF liquid is supplied at room temperature, the temperature of wafer W of the liquid film forming region is decreased. Meanwhile, as shown in FIG. 7, since lamp heater 61 is placed closer to the inner circumferential side of wafer W than the liquid film forming region, radiant heat from lamp heater 61 reaches both a region at which HF liquid has not been supplied (a region in which the liquid film is not formed) and the liquid film forming region, in the circumferential edge of wafer W.

And, radiant heat reached the region at which the liquid film is not formed is absorbed in wafer W, the heat absorbed in wafer W is conducted to the outer circumferential side of which temperature is decreased with supplying of HF liquid, and functions to increase the temperature of a region at which HF liquid is supplied. Meanwhile, the radiant heat reached the liquid film forming region functions to increase the contact temperature between wafer W and the HF liquid by heating the HF liquid.

In this case, as shown in FIG. 4, the radiant heat emitted from lamp heater 61 is reflected at reflecting surface 531 to be irradiated toward the region at which HF liquid is supplied, so that the HF liquid can be efficiently heated. Further, if the liquid film forming region is narrower than the irradiated region of the radiant heat from reflecting surface 531, wafer W is directly heated at the region in which the liquid film is not formed. Still further, gas that flows in a region between cover member 5 and wafer W is heated within concave portion 53, as in the case where the HF liquid is not yet supplied, and functions to heat wafer W or the HF liquid while through-flowing a gap between wafer W and protrusion 55.

As described above, in liquid processing apparatus 1 according to the exemplary embodiment, lamp heater 61 is placed closer to inner side than the supplying region of the chemical liquid along the circumferential direction of wafer W, so that a contacting portion between the HF liquid and wafer W can be heated by three types of heating methods such as heating by the radiant heat for a portion of the circumferential edge not covered with liquid film, heating by the radiant heat for HF liquid forming the liquid film by the radiant heat, and an indirect heating by utilizing a gas. Further, the temperature of wafer W is increased by a direct heating for wafer W, a direct heating for HF liquid supplied to the upper surface side, and an indirect heating for wafer W and the HF liquid by utilizing a gas, so that a contacting portion between the HF liquid supplied to the lower surface side and wafer W can be heated indirectly.

Still further, lamp heater 61 is placed closer to the inner circumferential side of wafer W than the liquid film forming region of HF liquid, so that the droplets or mist of the HF liquid dispersed toward outer side of wafer W caused by a centrifugal force flows toward cup body 2 without contacting lamp heater 61. Further, a gap with wafer W is narrowed by protrusion 55, so that the mist of the HF liquid is prevented from being reintroduced into concave portion 53. With such configurations, corrosion of quartz tube 612 of lamp heater 61 can be prevented.

Meanwhile, cover member 5 is also heated by lamp heater 61 for a period of time during which heating by lamp heater 61 is performed. However, since radiation fins 542 are provided at the upper surface side of a ceiling portion of concave portion 53, heat received from lamp heater 61 can be efficiently radiated. Further, since radiation fins 541 are also provided between a region at which lamp heater 61 is provided and an upper region of vacuum chuck 31, the heat received from lamp heater 61 is difficult to be transferred to the upper region of vacuum chuck 31, so that a temperature increase of vacuum chuck 31 can be prevented. As a result, warping of vacuum chuck 31 caused by a thermal expansion is prevented, so that the liquid processing can be performed without decreasing a force that absorbs and maintains wafer W.

As such, output of lamp heater 61 is adjusted to allow the contact temperature between the HF liquid and wafer W to be on the order of 60° C., and if the liquid processing has been performed for a time, for example, of 60 second, the supplying of HF liquid from chemical liquid nozzle 621 and chemical liquid supplying port 251 is stopped. Thereafter, chemical liquid nozzle 621 for supplying the HF liquid is switched, and a rinse process is performed by supplying deionized water (DIW) to the circumferential edge of wafer W rotating at 300 rpm to 3000 rpm. If DIW becomes high temperature during the rinse process to allow a reaction to be progressed with a remaining chemical liquid, and which is problematic, supplying electric current to lamp heater 61 during the rinse processing may be stopped. If there is no such a problem, supplying of an electric current to lamp heater 61 is not stopped during the rinse processing.

If the rinse processing has been performed for a predetermined time, supplying of DIW is stopped and a spin drying for DIW is performed by adjusting the rotation of wafer W to be 300 rpm to 3000 rpm. Wafer W or gas may be heated by supplying electric current to lamp heater 61 in the drying process. A time for spin drying may be shortened by heating wafer W or gas. And, if the spin drying is completed, the liquid processing is completed by stopping the rotation of wafer W and transferring wafer W to the pick outside in a reverse operation as compared to a carrying in operation.

Liquid processing apparatus 1 according to the exemplary embodiment has the following effects. Liquid processing apparatus 1 is provided with cover member 5 arranged at an upper surface of the substrate held on the substrate holder 3 to oppose the substrate and have a space therebetween, gas is supplied to the space by gas supplying port 51 provided on the central portion of cover member 5, and lamp heater 61 configured to heat the circumferential edge of wafer W and the gas is provided in the space along a circumferential direction of wafer W. In this case, since a supplying position of the chemical liquid (for example, HF liquid) to wafer W is closer to the circumferential edge than a placing position of the lamp heater 61, the circumferential edge to which the chemical liquid has not been supplied can be heated. Further, the gas is heated by lamp heater 61 to allow indirect heating by the heat of gas to be progressed when the heated gas reaches the contacted portion between wafer W and the chemical liquid, so that the contacted portion can be efficiently heated. As such, according to the exemplary embodiment, wafer W and the gas and chemical liquid supplied to wafer W are heated by lamp heater 61 to efficiently heat the circumferential edge of wafer W, so that the processing efficiency can be increased.

Here, HF liquid as a chemical liquid is used for removing an unnecessary film in liquid processing apparatus 1, however, the kind of the chemical liquid used for a liquid processing and the type of the liquid processing are not limited to the HF liquid and removal of film, respectively. For example, the unnecessary film may be removed by using other chemical liquid such as diluted HCL, and the removal of film may be performed only for the upper surface side of the circumferential edge of wafer W. Further, the type of liquid processing is not limited to the removal of film formed on the lower surface side of wafer W, and other types of liquid processing, for example, a cleaning process or the like may be performed. In such a case, the temperature of the circumferential edge of wafer W heated by using lamp heater 61 is adequately selected according to the type of liquid processing executed or the kind of the chemical liquid selected.

Further, the configuration of lamp heater 61 provided along the circumferential edge of wafer W hold on wafer holder 3 is not limited to an example of elongated and narrow lamp heater 61 formed with omega shape (Ω). For example, a plurality of ball-shaped lamp heater 61 may be arranged along the circumferential direction of wafer W. Further, even if the elongated and narrow lamp heater 61 is provided along the circumferential direction of wafer W, the "provided along the circumferential direction" is not necessarily to be provided in a ring shape and, for example, may be placed in a rectangular plane shape as long as the circumferential edge of wafer W can be heated. Further, there is illustrated lamp heater 61 provided with carbon filament 611 emitting more electromagnetic wave corresponding to electromagnetic absorption wavelength by water than a halogen lamp. However, it does not mean that a halogen lamp as lamp heater 61 may not be employed. The type of lamp heater 61 is adequately selected according to the kind of the chemical liquid or a targeted heating temperature. Further, the substrate to be processed is also not limited to the above-described wafer W (a circular substrate), and a rectangular shaped substrate to be subjected to the liquid processing may be employed as well.

Further, cover member 5 may be not provided with gas supplying port 51, the region at which radiation fins 541 and 542 are provided is not limited to that illustrated in liquid processing apparatus 1. For example, radiation fins 541 and 542 may be provided throughout the upper surface side of cover member 5, and cover member not provided with radiation fins 541 and 542 may be utilized. Further, concave portion 53 of cover member 5 is not limited to be formed in an omega (Ω) shape adapted for the shape of lamp heater 61. For example, only protrusion 55 may be provided at the circumferential edge of cover member 5 protruding downward, and the entire space of lower side of cover member 5 may be used as concave portion 53. The nitrogen gas except for clean air may be utilized in down flow within case 11.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for performing a liquid processing comprising:
   a substrate holder configured to hold a substrate to be processed horizontally;
   a chemical liquid supplying unit configured to supply chemical liquid to a circumferential edge of the substrate while rotating the substrate around a vertical axis;
   a cover member arranged at an upper surface of the substrate held on the substrate holder to oppose the substrate and have a space therebetween;
   a gas supplying port provided on the cover member to supply gas to the space;
   a lamp heater provided in the space along a circumferential direction of the substrate configured to heat the circumferential edge of the substrate; and
   a protrusion provided at the circumferential edge of the cover member along the circumferential direction protruding downward, so as to form a gap, a height of the gap being smaller than a height between the substrate and the cover member, in the space where the lamp heater is provided,
   wherein a supplying position of the chemical liquid from the chemical liquid supplying unit is closer to the circumferential edge than a placing position of the lamp heater.

2. The apparatus of claim 1, wherein the cover member is formed along the circumferential direction of the substrate held by the substrate holder and provided with a concave portion open toward a lower surface, and the lamp heater is provided in the concave portion.

3. The apparatus of claim 2, wherein an inner surface of the concave portion to which the lamp heater is provided is finished with a mirror-like surface.

4. The apparatus of claim 3, wherein the concave portion having the minor-like inner surface includes a reflecting surface configured to reflect radiant heat emitted from the lamp heater toward a circumferential edge region of the substrate to which the chemical liquid is supplied.

5. The apparatus of claim 1, wherein the cover member includes a radiation fin.

6. The apparatus of claim 5, wherein the radiation fin is arranged at an upper surface side of the cover member corresponding to a region where the lamp heater is placed.

7. The apparatus of claim 5, wherein the substrate holder includes a vacuum chuck absorbing and maintaining a central portion of the lower surface of the substrate, and the radiation fin is arranged at an interspace of the cover member between the lamp heater and the vacuum chuck when viewed from the upper surface of the cover member.

8. The apparatus of claim 1, further comprising a controller configured to supply electric current to the lamp heater for a period of time during which the chemical liquid is supplied from the chemical liquid supplying unit, and stop supplying electric current to the lamp heater after the supplying of the chemical liquid from the chemical liquid supplying unit is stopped.

9. The apparatus of claim 1, wherein the chemical liquid is corrosive.

10. The apparatus of claim 1, wherein the lamp heater is formed with an omega (Ω) shape having a notch portion at a ring portion by inserting a narrow and elongated heating element into a protective tube made of quartz, and the supplying position of the chemical liquid is defined at a circumferential edge of a region where the notch portion is formed.

* * * * *